(12) United States Patent
Yudasaka et al.

(10) Patent No.: US 6,621,101 B2
(45) Date of Patent: Sep. 16, 2003

(54) THIN-FILM TRANSISTOR

(75) Inventors: Ichio Yudasaka, Suwa (JP); Mitsutoshi Miyasaka, Suwa (JP); Piero Migliorato, Cambridge (GB)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/936,042

(22) PCT Filed: Jan. 2, 2001

(86) PCT No.: PCT/GB01/00008

§ 371 (c)(1),
(2), (4) Date: Dec. 12, 2001

(87) PCT Pub. No.: WO01/50515

PCT Pub. Date: Jul. 12, 2001

(65) Prior Publication Data

US 2003/0057424 A1 Mar. 27, 2003

(30) Foreign Application Priority Data

Jan. 7, 2000 (GB) .............................................. 0000372

(51) Int. Cl.$^7$ ............................................. H01L 29/786
(52) U.S. Cl. ......................... 257/66; 257/349; 257/611; 257/612; 257/617
(58) Field of Search ......................... 257/66, 349, 611, 257/612, 617

(56) References Cited

U.S. PATENT DOCUMENTS 6,337,500 B1 * 1/2002 Nakaoka et al. ............ 257/347

FOREIGN PATENT DOCUMENTS

| EP | 0 401 577 A | 12/1990 |
|---|---|---|
| GB | 1 543 132 A | 3/1979 |
| JP | 58064064 | 4/1983 |
| JP | 62104172 | 5/1987 |
| JP | 01025573 | 1/1989 |
| JP | 2-306665 | 12/1990 |

OTHER PUBLICATIONS

Migliorato, P. et al., Anomalous Off–Current Mechanisms in N–Channel Poly–Si Thin Film Transistors:, Solid State Electronics, GB, Elsevier Science Publishers, Barking, vol. 387, No. 12, Dec. 1, 1995.

Balasinski A., et al.: "Observation of Two Types of Trapping Centers in Thin Film Transistors Using Charge Pumping Technique" IEEE Electron Device Letters, U.S., IEEE, Inc., New York, vol. 16, No. 10, Oct. 1, 1995.

* cited by examiner

*Primary Examiner*—Jerome Jackson
(74) *Attorney, Agent, or Firm*—Oliff & Berridge, PLC

(57) ABSTRACT

The present invention provides, in a TFT, a channel region facing a gate electrode through a gate insulating film, a source electrode connected to the channel region and a drain region connected to the channel region on the side opposite the source region that are formed in a polycrystal semiconductor film that was patterned in island forms. In the channel region, a recombination center is formed for capturing a small number of carriers (holes) by impurities, such as inert-gas, metals, Group III elements, Group IV elements and Group V elements, introduced to a predetermined region in this channel region, or by defects generated due to the introduction of these impurities. The present invention thus provides an arrangement restraining bipolar transistor type behavior to stabilize saturation current and to provide a TFT that can improve reliability.

9 Claims, 17 Drawing Sheets

THIN-FILM TRANSISTOR

BACKGROUND OF THE INVENTION

1. Field of Invention

The present invention relates to a thin-film transistor (TFT), and more specifically, relates to an improved art of TFT transistor characteristics.

2. Description of Related Art

The various devices which use TFTs can include active matrix liquid display devices. For instance, FIG. 11(A) shows an active matrix liquid crystal display device that is formed on a transparent substrate, such as glass, and having a roughly central region that is identified as a picture display region 81. In this picture display region 81, picture elements are formed into sections by data lines 90 and scanning lines 91 composed of a metal film, such as aluminum, tantalum, molybdenum, titanium and tungsten, a silicide film, a conductive semiconductor film, or the like. In each picture element, a liquid crystal unit 94 (liquid crystal cell) is formed where picture signals are input through a TFT 30 for picture switching. To the data lines 90, a data-side drive circuit 60 is constructed that includes a shift register 84, a level shifter 85, video lines 87 and analog switches 86. To the scanning lines 91, scanning-side drive circuits 70 are constructed that have a shift register 88 and a level shifter 89. In each picture element, a holding capacitor 40 is formed between the scanning line 91 and a capacity line 92 extending parallel thereto. The holding capacitor 40 has a function to improve the holding characteristics of charge at the liquid crystal units 94. This holding capacitor 40 is sometimes formed between the scanning line 91 of the front stage and a picture element electrode.

At the data-side and the scanning-side drive circuits 60 and 70, respectively, a CMOS circuit is constructed with an N type TFT 10 and a P type TFT 20 as shown in FIG. 11(B). Such CMOS arrangement is used to implement an inverter circuit, etc. with more than one or two stages at the drive circuits 60 and 70.

Therefore, on the active matrix substrate 200, three types of TFTs are formed on the surface of the substrate that include an N type TFT 10 for the drive circuit, a P type TFT 20 for the drive circuit and an N type TFT 30 for picture element switching. However, these TFTs 10, 20 and 30 have a common structure. Thus, in order to avoid redundancy of explanation, the structure of the N type TFT 10 for the drive circuit, as well as the manufacturing method thereof, will be explained with reference to FIG. 12, FIG. 13, FIG. 14 and FIG. 15.

As illustrated in FIG. 12, on the active matrix substrate 200, a bedding protective film 51 made of a silicon oxide film is formed at the surface side of the substrate 50. On the surface of this bedding protective film 51, a polycrystal semiconductor film 100 is formed that is patterned into island forms. On the surface of the semiconductor film 100, a gate insulating film 12 is formed, and a gate electrode 14 is formed on the surface of this gate insulating film 12. In the semiconductor film 100, a channel region 15 is formed at a region facing the gate electrode 14 through the gate insulating film 12. At the sides of this channel region 15, a high concentration source region 16 and a high concentration drain region 17 are formed in a self-aligned condition relative to the gate electrode 14. To the high concentration source region 16 and high concentration drain region 17, a source electrode 41 and a drain electrode 42 are electrically connected respectively through contact holes in an interlayer insulating film 52.

In order to manufacture the TFT 10 with such a structure, first, a substrate made of glass, etc. is cleaned by ultrasonic cleaning or the like as in FIG. 13 (A). Subsequently, as shown in FIG. 13 (B), a bedding protective film 51 is formed over the entire surface of the substrate 50 under the conditions of a substrate temperature from about 150 to 450° C.

Thereafter, as illustrated in FIG. 13 (C), a semiconductor film 100 is formed on the surface of the bedding protective film 51. At this time, by applying a low temperature process, the substrate 50 made of glass is prevented from being thermally deformed. A low temperature process indicates that the maximum temperature in the process (the maximum temperature wherein the temperature of a substrate as a whole increases at the same time) is lower than about 600° C. (preferably, less than about 500° C.). On the contrary, a high temperature process indicates that the maximum temperature of the process (the maximum temperature wherein the temperature of a substrate increases as a whole at the same time) is higher than about 600° C. This involves carrying out a high temperature procedure at 700–1,200° C. such as film-formation under high temperature and thermal oxidation of silicon.

However, since it is impossible to form a polycrystal semiconductor film directly on the substrate in the low temperature process as explained later, this semiconductor film 100 should be crystallized after an amorphous semiconductor film 100 is formed first by a plasma CVD method or a low pressure CVD method. Methods such as the Solid Phase Crystallization (SPC) method and Rapid Thermal Annealing (RTA) method for instance, are included as this crystallization method. As shown in FIG. 13 (D), by carrying out laser annealing wherein excimer laser beams using XeCl are irradiated (ELA: Excimer Laser Annealing/crystallization process), the rise in substrate temperature is restrained, and polycrystal Si with a large grain diameter is also provided.

In this crystallization process, laser beams (excimer laser) from a laser beam source 320, for example, are irradiated toward the substrate 50 that is placed on a stage 310 through an optical system 325 as shown in FIG. 14. In this process, line beams L0 wherein an irradiation range L is long in an X direction (for example, line beams at 200 Hz of laser pulse cyclic frequencies) are irradiated onto the semiconductor film 100, and the irradiation region L is shifted in a Y direction. The beam lengths of the line beams L0 are 400 mm herein, and the output intensity thereof is, for instance, 300 mJ/cm². Also, in shifting the irradiation region L of laser beams in the Y direction, the line beams are scanned so as to overlap sections with 90% of the peak laser intensity in the width direction per region. As a result, the amorphous semiconductor film 100 is melted once, and is then polycrystallized after a cooling and solidifying process. In this process, the irradiation period of laser beams to each region is extremely short and the irradiation region L is local relative to the substrate as a whole, so that the substrate 50 as a whole is not heated to a high temperature at the same time. Thus, even though the glass substrate used as the substrate 50 is inferior to a quartz substrate in heat resistance, deformation, cracks, etc. are not formed by heat.

Next, as shown in FIG. 13 (E), the polycrystal semiconductor film 100 is patterned in island forms by the photolithography technique.

Next, as illustrated in FIG. 15 (A), a gate insulating film 12 made of a silicon oxide film is formed at the surface side of the semiconductor film 100.

Next, as shown in FIG. 15 (B), a conductive film 140 containing aluminum, tantalum, molybdenum, titanium, tungsten, etc. is formed by a sputtering method. After forming a resist mask 301 on the surface of the conductive film 140, as shown in FIG. 15 (C), the conductive film 140 is patterned and a gate electrode 14 is then formed as shown in FIG. 15 (D).

Next, as illustrated in FIG. 15 (E), phosphorus ions are introduced at the dosage of about e.g., $1 \times 10^{15}$ cm$^{-2}$ to the semiconductor film 100 with the gate electrode 14 as a mask. As a result, a source region 16 and a drain region 17 are formed in the semiconductor film 100 in a self-aligned condition relative to the gate electrode 14 and at the high concentration of about $1 \times 10^{20}$ cm$^{-3}$ in impurity concentration. The section in the semiconductor film 100 where the impurities are not introduced becomes a channel region 15.

After forming an interlayer insulating film 52 as shown in FIG. 12, annealing is carried out for activation. Then, after contact holes are formed in the interlayer insulating film 52, a source electrode 41 and a drain electrode 42 are formed.

SUMMARY OF THE INVENTION

In an N type TFT constructed as mentioned above, drain voltage that is positive relative to the potential of the source electrode 16 is applied to the drain electrode 42 as in FIG. 16 (A), and positive gate voltage is applied to the gate electrode 14. As a result, negative electric charge concentrates on the interface of the channel region 15 and the gate insulating film 12, forming an N type channel 151 (inversion layer). At this time, when drain voltage is small enough relative to gate voltage, the source region 16 and the drain region 17 are connected by the channel 151, so that drain electric current increases as drain voltage (non-saturation region) rises as indicated with a solid line L0 in the transistor characteristics (current-voltage characteristics) shown in FIG. 17. On the contrary, as drain voltage increases to where it almost equals the gate voltage, induced electron density near the drain region becomes small as shown in FIG. 16 (B), thus causing a pinch-off. Under this condition, even if drain voltage is increased higher than that level, drain electric current does not increase and becomes almost constant (at the saturation region) as indicated with the solid line L0 in FIG. 17. The current value in this case is called saturation current. Thus, if the TFT 10 is driven by applying this saturation region, constant drain current can be obtained, thus preventing the TFT 10 itself and peripheral circuits from being damaged by excess current.

As described above, the transistor characteristics of a TFT are basically dominated by the behavior of plural carriers (electrons in case of the N type, and holes in case of the P type). However, when drain voltage becomes high, a phenomenon (Kink effect) is found wherein the above-noted drain current, which should be constant, abnormally increases. The reason will be explained below. First, as drain voltage becomes high and an electric field between the source and the drain intensifies at the TFT, carriers are accelerated by this electric field and will have a lot of energy. The carriers are accelerated from the source region 16 towards the drain region 17, so that they will have the maximum energy near the drain region 17. The carriers with large energy (hot carriers) collide against the atoms in the semiconductor film and impurity atoms, thus generating pairs of electrons and holes. The generated holes, as shown in FIG. 16 (C), increase the potential of the channel region 15, and electric current in response to the injection of the holes mentioned above flows from the channel region 15 to the source region 16. Such a phenomenon can be considered by relating the channel region 15 to a base, the source region 16 to an emitter and the drain region 17 to a collector respectively. The electric current by holes flowing from the channel region 15 to the source region 16 can be considered as base current. The electric current flowing from the source region 16 to the drain region 17 in response to the electric current flowing from this channel region 15 to the source region 16 can be considered as collector electric current. Therefore, this phenomenon is also called bipolar action. With such bipolar transistor type behavior (bipolar action), drain current increases sharply (Kink effect) even at the saturation region as drain voltage rises in the case of a conventional TFT as indicated with a two-dot chain line L1 in FIG. 17. As a result, there is a danger that the TFT 10 itself and the peripheral circuits would be damaged by excess current. In addition, such a phenomenon will be clear as the ON-state current level of the TFT 10 rises by increasing the degree of crystallization of the semiconductor film 100, so that the reliability tends to decline at a higher ON-state current level in the case of a conventional TFT 10.

Therefore, the objectives of the present invention are to reduce the bipolar transistor type behavior and to present a TFT that can stabilize saturation current and improve reliability.

In order to solve the problem mentioned above, in a thin-film transistor 10 wherein a channel region 15 facing a gate electrode 14 through a gate insulating film 12 and source and drain regions 16 and 17 connected to the channel region 15 are formed in a semiconductor film 100 on the surface of an insulating substrate 50 as illustrated in FIG. 16 (D), the present invention is characterized in that a recombination center 150 is formed in the above-noted channel region 15 for capturing carriers.

The operation and effects of the TFT of the present invention are explained by referring to an N type TFT as an example, even if drain voltage becomes high and hole/electron pairs are generated by hot carriers, these holes and electrons are recombined and captured at the recombination center 150 formed in the channel region 15. As a result, as holes are injected into the source region 16 from the channel region 15, hole density would not become high, so that the injection of electrons from the source region 15 to the channel region 15 due to this hole-injection will not occur. Thus, there are no fluctuations in saturation current resulting from the bipolar transistor type behavior mentioned above. As a result, in the case of the TFT of the present invention, as illustrated with a dotted line L2 or a one-dot chain line L3 in FIG. 17, drain current will not increase sharply even if drain voltage fluctuates at the saturation region. Therefore, TFT itself and peripheral circuits will not be damaged by excess current, etc., thus improving reliability.

In the present invention, it is preferable that the recombination center concentrates at a location near the drain region in the channel region. For example, in the channel region, the recombination center preferably concentrates at a region that is separated only at a distance equivalent to $\frac{1}{3}$ or $\frac{1}{10}$ of the channel length from the drain region.

In the present invention, the recombination center can be formed by impurities introduced to the channel region or by crystal defects. In this case, the impurities are at least one kind of impurity selected from the group consisting of inert-gas, metals, Group III elements, Group IV elements and Group V elements.

In the present invention, the density of the recombination center is preferably within the range from $1 \times 10^{13}$ cm$^{-3}$ to $1 \times 10^{20}$ cm$^{-3}$. Also, a carrier-capturing cross section at the recombination center is preferably within the range from $1 \times 10^{13}$ cm$^2$ to $1 \times 10^{-20}$ cm$^2$.

In the present invention, a structure wherein the recombination center concentrates on the side where the gate electrode is located in the direction of thickness of the channel region, or a structure wherein the recombination center concentrates on the side opposite to the side where the gate electrode is located in the direction of thickness of the channel region may be adopted.

BRIEF DESCRIPTION OF THE DRAWINGS

The invention will be described with reference to the accompanying drawing, in which like elements are referred to with like numerals, and in which.

DETAILED DESCRIPTION OF PREFERRED EMBODIMENTS

Figure 1:
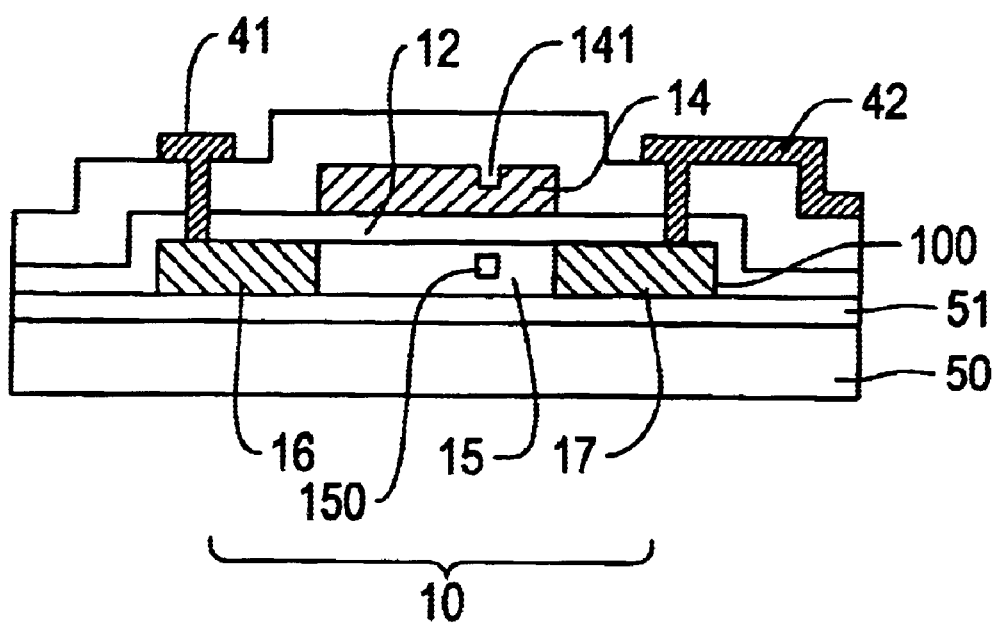
FIG. 1 is a cross-sectional view illustrating the structure of a TFT of embodiment 1 of this invention.
Figure 2A:
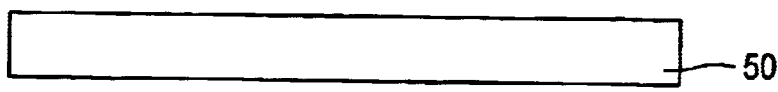
FIGS. 2 (A)–(E) are cross-sectional views showing the manufacturing method of the TFT shown in FIG. 1.
Figure 2B:
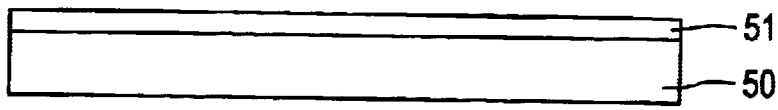
Figure 2C:
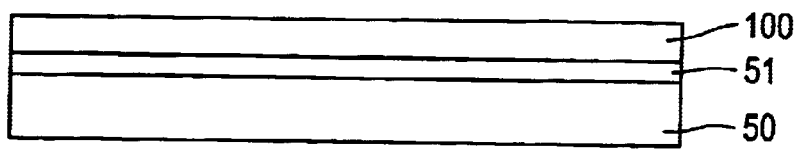
Figure 2D:
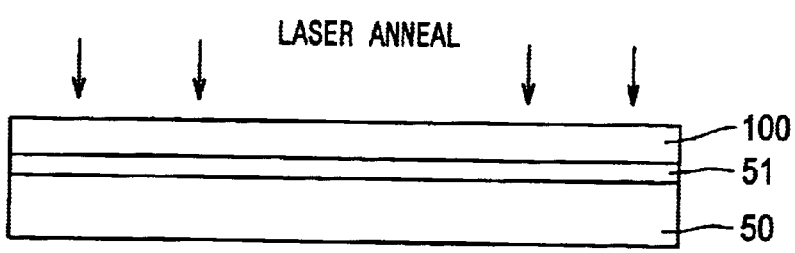
Figure 2E:
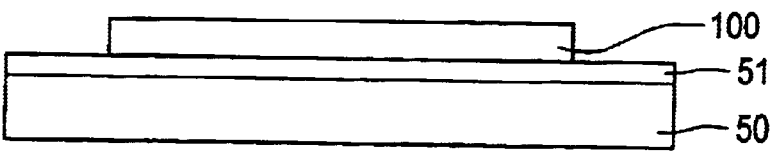
Figure 3A:
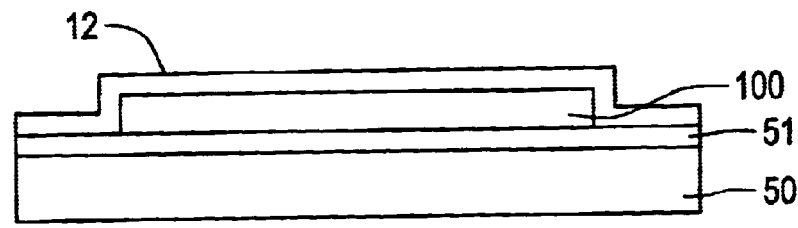
FIGS. 3 (A)–(D) are, in the manufacturing method of the TFT shown in FIG. 1, cross-sectional views showing each process that continues after the processes shown in FIGS. 2.
Figure 3B:
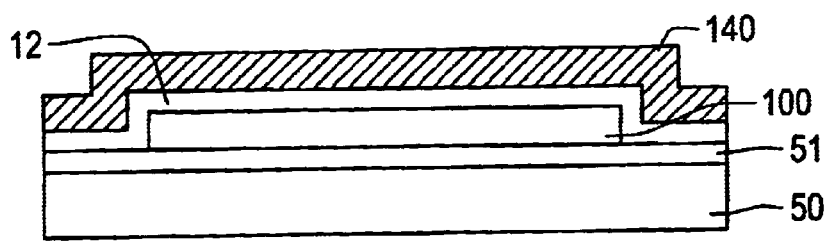
Figure 3C:
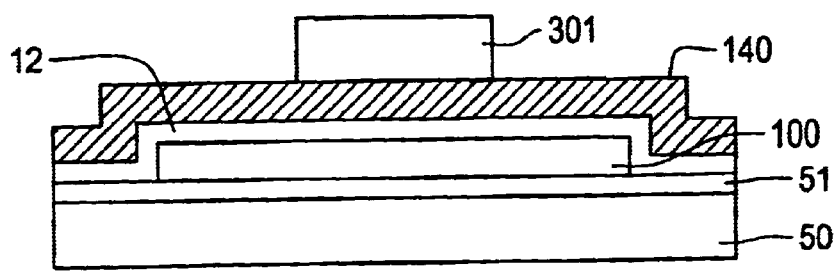
Figure 3D:
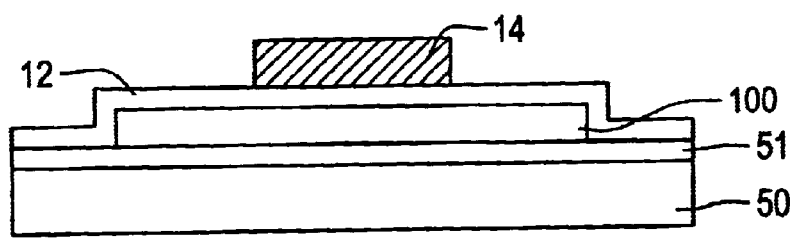

Embodiments for carrying out the present invention are explained with reference to the figures. In the embodiments which will be explained below, a TFT is formed for picture-element switching or a drive circuit in an active matrix substrate for a liquid crystal display device, etc. Therefore, as described in the explanation of the related art, three types of TFTs including an N type TFT for a drive circuit, a P type TFT for a drive circuit and an N type TFT for picture-element switching should be formed on the same substrate. However, these TFTs have a common structure. Moreover, a TFT adopting this invention has a structure that is similar to that of the conventional TFT apart from the addition of the recombination center. Thus, in the following explanation, in order to avoid redundancy of explanation, the same reference numerals are used for the same elements as in the conventional TFT and for the manufacturing method thereof, and only the structure of an N type TFT for a drive circuit and the manufacturing method thereof will be explained.

FIG. 1 is a cross-sectional view illustrating the structure of a TFT of embodiment 1 of the invention. As shown in FIG. 1, in this embodiment, a bedding protective film 51 made of a silicon oxide film is formed on the surface side of a substrate 50, and an N type TFT 10 is formed on the surface of this bedding protective film 51. On the surface of this bedding protective film 51, a polycrystal semiconductor film 100 patterned in island forms is formed. On the surface of the semiconductor film 100, a gate insulating film 12 is formed, and a gate electrode 14 is formed on the surface of this gate insulating film 12. In the semiconductor film 100, a channel region 15 is formed at a region facing the gate electrode 14 through the gate insulating film 12. At the sides of this channel region 15, high concentration source region 16 and drain region 17 are formed in a self-aligned condition relative to the gate electrode 14. To the source region 16 and drain region 17, a source electrode 41 and a drain electrode 42 are electrically connected, respectively, through contact holes of an interlayer insulating film 52.

One section on the surface of the gate electrode 14 is hollow, and there is a partially thin section 141. This section 141 is for introducing impurities to a predetermined region of the channel region 15 in a manufacturing method described below.

In the TFT 10 constructed as above, a recombination center 150 is formed in the channel region 15 by impurities such as inert-gas, metals, Group III elements, Group IV elements and Group V elements that are introduced to this channel region 15, or by crystal defects generated by the introduction of these impurities. The recombination center 150 concentrates on a location near the drain region 17 in the channel region 15 herein. In other words, the recombination center 150 concentrates on a region that is separated only by a distance equivalent to $\frac{1}{3}$ or $\frac{1}{10}$ of the channel length seen from the drain region 17.

In this embodiment, the density of the recombination center 150 can be within the range from $1 \times 10^{13} \text{cm}^{-3}$ to $1 \times 10^{20} \text{cm}^{-3}$, and a carrier-capturing cross section at the recombination center 150 is within the range from $1 \times 10^{-13}$ $\text{cm}^2$ to $1 \times 10^{-20} \text{cm}^2$. The carrier-capturing cross section and density of such a recombination center 150 can be controlled by the dosage of impurities into the semiconductor film 100 (channel region 15) in the manufacturing method mentioned below.

Regarding the depth of the recombination center 150, it may be either a structure wherein the recombination center 150 concentrates on the side where the gate electrode 14 is located in the direction of thickness of the channel region 15, or a structure wherein the recombination center 150 concentrates on the side opposite to the side where the gate electrode 14 is located in the direction of thickness of the channel region herein. However, the recombination center 150 is formed so as to concentrate at a suitable location in response to the correlation between the thickness of the channel region 15 and the depth of a channel formed on the surface of this channel region 15, etc. The depth of the region where such a recombination center 150 concentrates can be controlled by acceleration voltage at the time of introducing impurities to the semiconductor film 100 (channel region 15), etc. in the manufacturing method described in greater detail below. In other words, it can be controlled by setting an average projected range during the injection of impurities to the semiconductor film 100, at the side of the gate electrode 14 or the side of the substrate 50 from the center in the direction of thickness of the channel-forming region 15.

Figure 17:
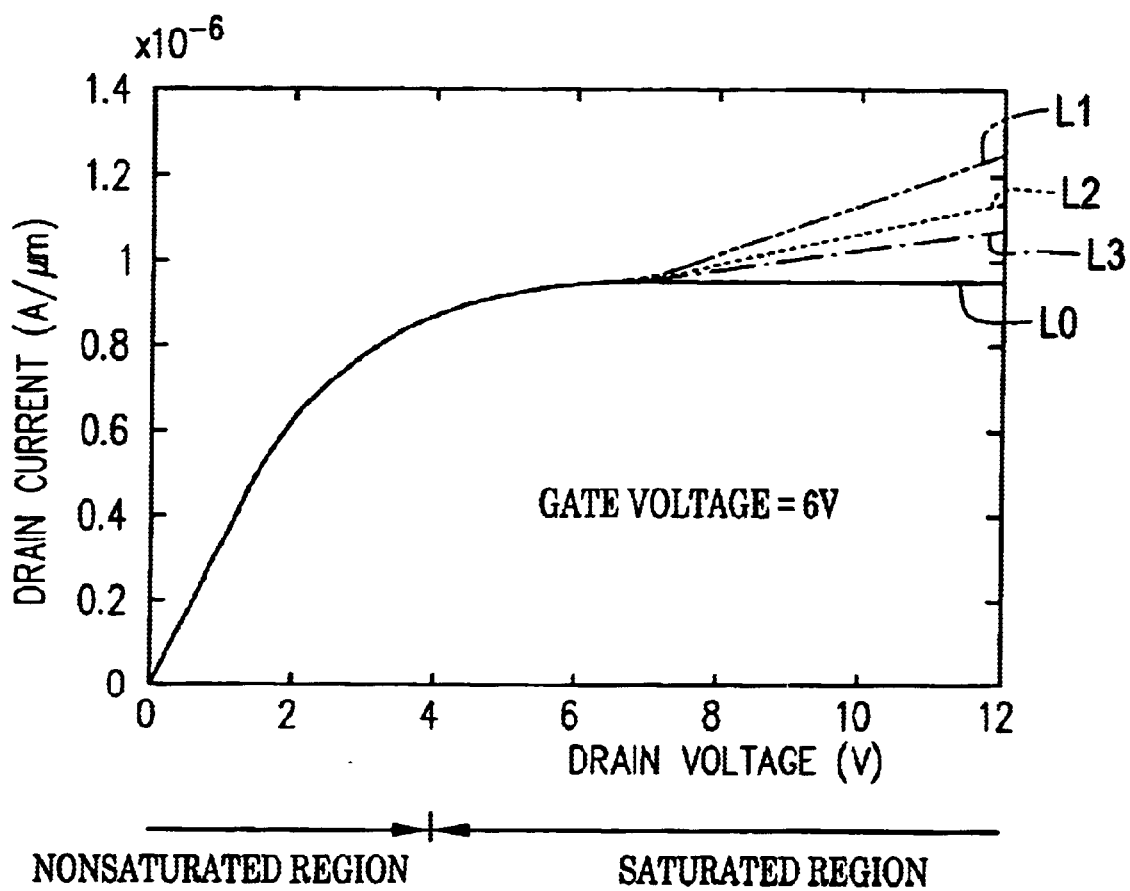
FIG. 17 is a graph showing the transistor characteristics of TFTs of this invention, a conventional TFT and a model TFT.

The transistor characteristics (current-voltage characteristics) of the TFT 10 constructed as above are explained with reference to FIG. 1 and FIG. 17. FIG. 17 is a graph showing the results wherein the transistor characteristics of the TFTs of this invention, the conventional TFT and a embodiment TFT are simulated. In FIG. 17, in the TFTs of this invention, the characteristics of TFTs—wherein the thickness of the semiconductor film 100 is 460 angstroms, channel length is 8 $\mu$m and the recombination center 150 is formed at a length of 2 $\mu$m from a location separated from the drain region 17 by 1 $\mu$m —are expressed as a dotted line L2 and a one-dot chain line L3 respectively. Among these two TFTs, the TFT expressed as the dotted line L2 has the carrier-capturing cross areas of charged recombination center 150 and neutral recombination center 150 of $1\times10^{-13}$ cm$^2$ and $1\times10^{-15}$ cm$^2$ respectively. On the other hand, the TFT expressed as the one-dot chain line L3 has the carrier-capturing cross areas of charged recombination center 150 and neutral recombination center 150 of $1\times10^{-12}$ cm$^2$ and $1\times10^{-14}$ cm$^2$ respectively. The so-called charged recombination center 150 normally has negative electric charge and becomes neutral by capturing holes. On the other hand, the neutral recombination center 150 is normally neutral and charges positively by capturing holes herein. Moreover, the density of the recombination center 150 of the TFTs expressed as either the dotted line L2 or the one-dot chain line L3 was set at $1\times10^{19}$ cm$^{-3}$.

In the TFT 10 constructed as above, when drain voltage is much smaller than gate voltage, the source region 16 and the drain region 17 are connected by a channel, so that drain current increases as drain voltage rises (non-saturation region) as illustrated with a solid line L0 in FIG. 17.

Also, as drain voltage rises as high as gate voltage, hole/electron pairs are formed by hot carriers. Formed holes are recombined and captured in the recombination center 150. Thus, many of the formed holes diminish in the channel region 15, so that the channel region 15 does not reach enough potential to inject holes into the source region 16. As a result, there will be no bipolar transistor type behavior (bipolar action) wherein electrons are injected into the channel region 15 from the source region 16 by the holes injected from the channel region 15 to the source region 16. Therefore, in case of the TFT 10 of this embodiment, as expressed with the dotted line L2 or the one-dot chain line L3 in FIG. 17, the Kink effect with a sharply increasing drain current at a saturation region can be restrained. As a result, by increasing the degree of crystallization of the semiconductor film 100, the TFT itself and peripheral circuits will not be damaged by excess current even if an ON-state current level or the like is raised, so that reliability can be also improved.

Figure 4A:
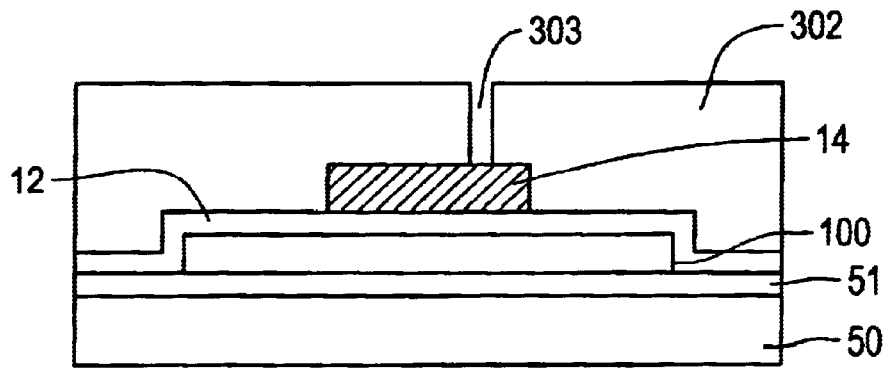
FIGS. 4 (A)–(C) are, in the manufacturing method of the TFT shown in FIG. 1, cross-sectional views showing each process that continues after the processes shown in FIGS. 3.
Figure 4B:
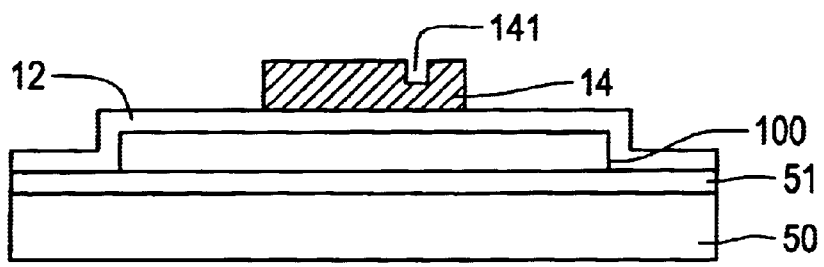
Figure 4C:
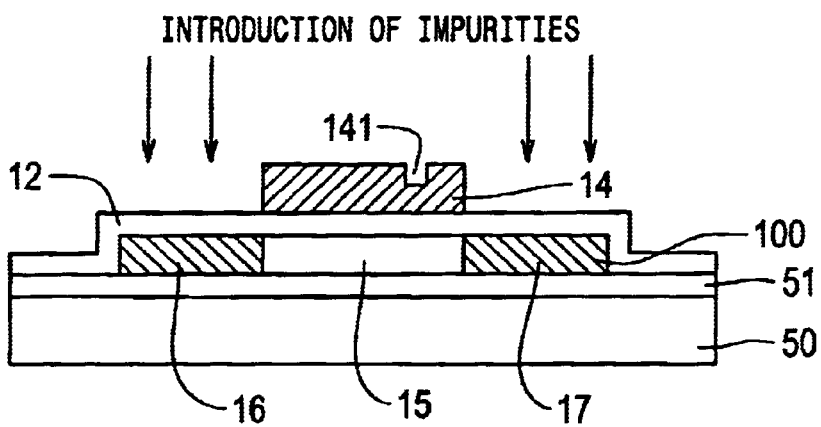

The method of manufacturing the TFT 10 having such a structure is explained with reference to FIG. 2, FIG. 3 and FIG. 4. As is apparent from the figures, FIG. 2, FIG. 3 and FIG. 4 are all cross-sectional views illustrating the manufacturing method of the TFT of this embodiment.

In this embodiment, a substrate 50 made of glass, etc. cleaned by ultrasonic cleaning or the like is first prepared, as shown in FIG. 2 (A). Next, as shown in FIG. 2 (B), a bedding protective film made of a silicon oxide film or the like at a thickness of 2,000–5,000 angstroms is formed over the entire surface of the substrate 50 by a plasma CVD method under the condition of a substrate temperature from about 150° C. to 450° C. A mixed gas of mono-silane and laughing gas, TEOS (tetraetoxysilane) and oxygen can be applied as the material gas.

As illustrated in FIG. 2 (C), a semiconductor film 100 is formed on the substrate 50. At this time, the thermal deformation of the glass substrate 50 is prevented by applying a low temperature process. In other words, under the condition of a substrate temperature from about 150° C. to 450° C., a semiconductor film 100 made of an amorphous silicon film with a thickness of 300–700 angstroms is formed over the entire surface of the substrate 50 by a plasma CVD method. Disilane or monosilane may be applied (in a film-forming process), for example, as the material gas. In addition, as the method of forming the amorphous semiconductor film 100 on the substrate 50 under low temperature conditions, a vacuum CVD method, an EB deposition method, a sputtering method or the like may be used instead of the plasma CVD method.

Figure 14:
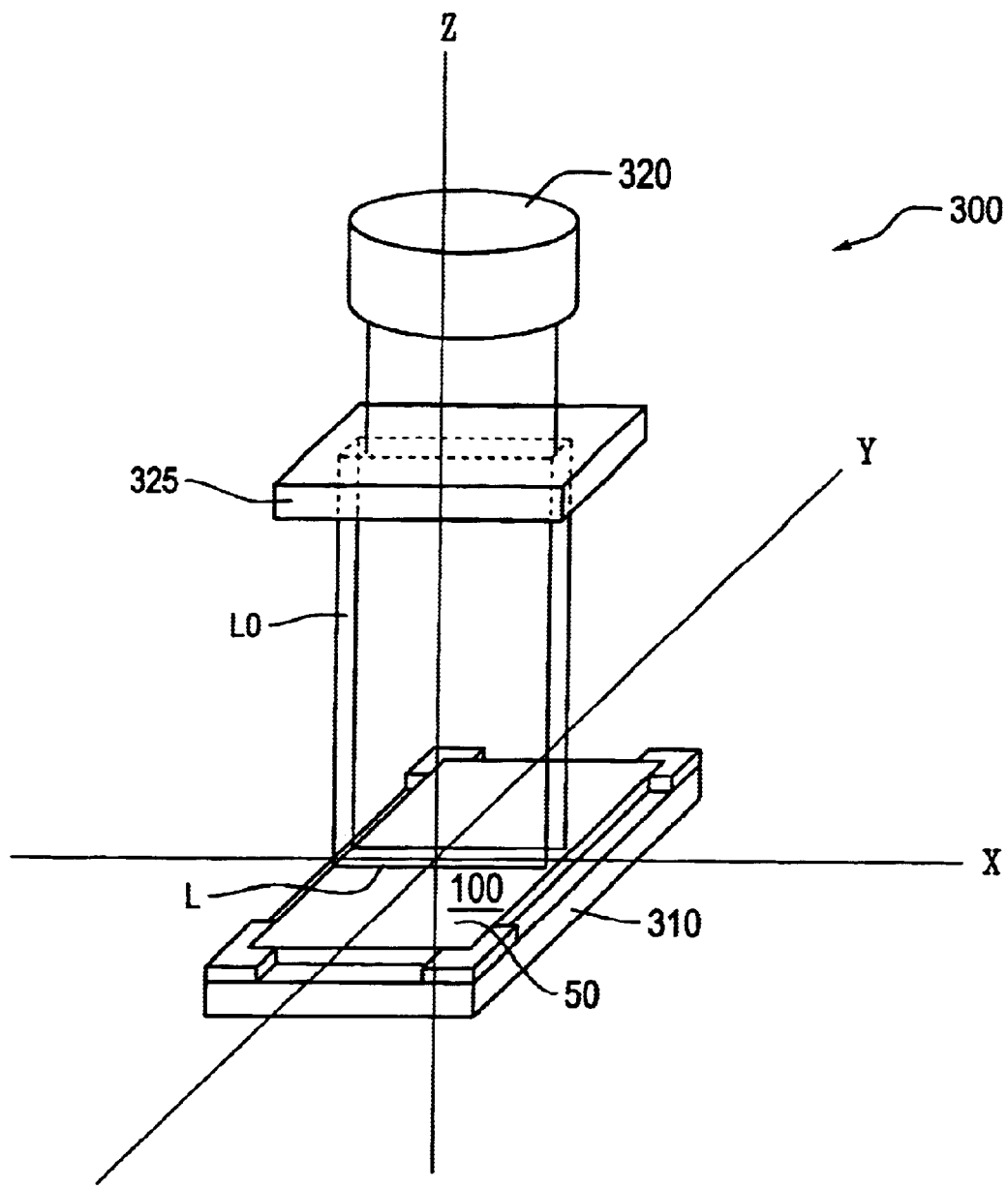
FIG. 14 is a schematic block diagram of a laser annealing device used for laser annealing (crystallization process)
Figure 15A:
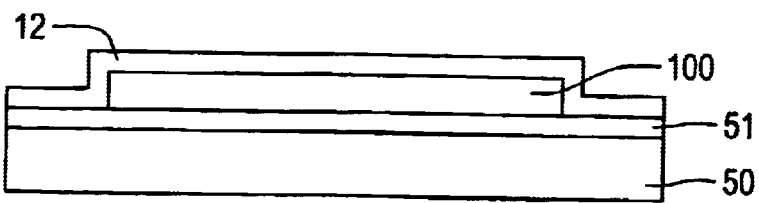
FIGS. 15 (A)–(E) are, in the manufacturing method of the TFT shown in FIG. 12, cross-sectional views showing each process that continues after the processes shown in FIGS. 13.
Figure 15B:
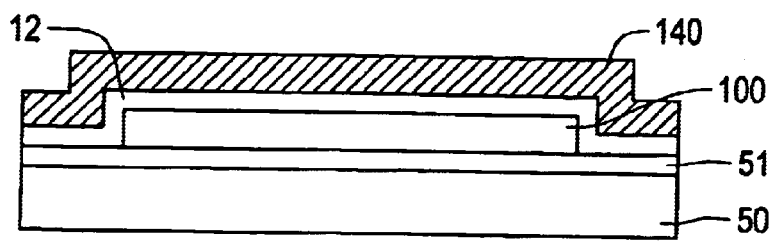
Figure 15C:
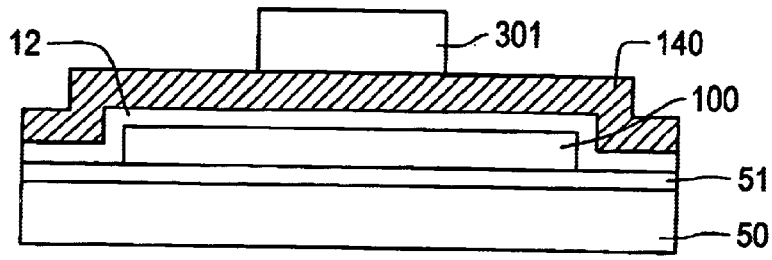
Figure 15D:
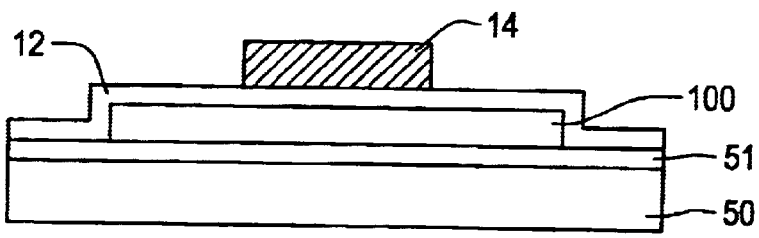
Figure 15E:
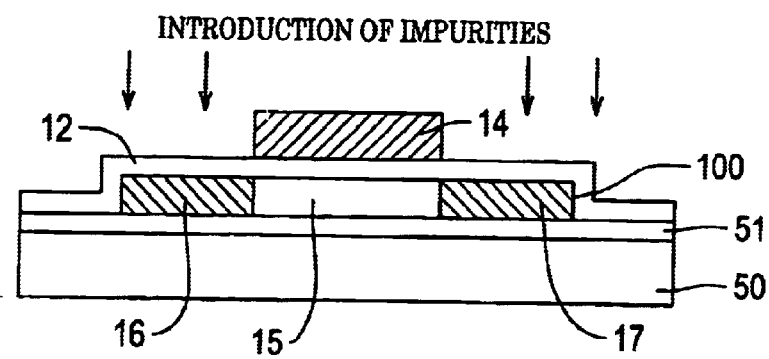
Figure 16A:
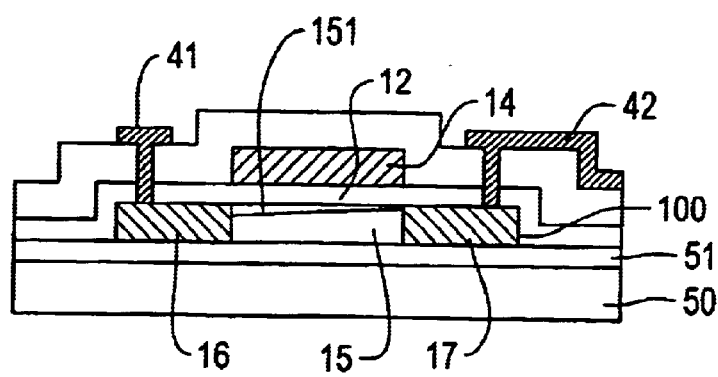
FIGS. 16 (A)–(D) are diagrams for explaining the operation of a TFT.
Figure 16B:
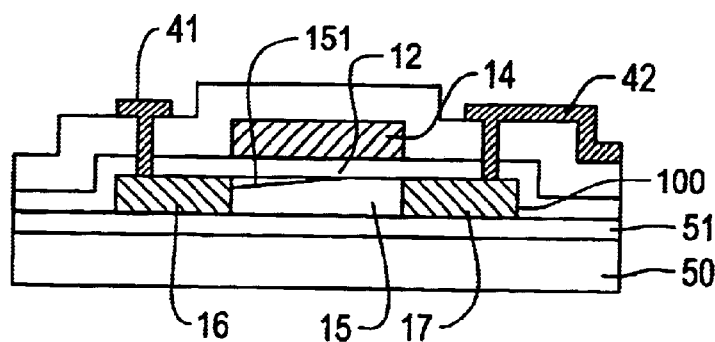
Figure 16C:
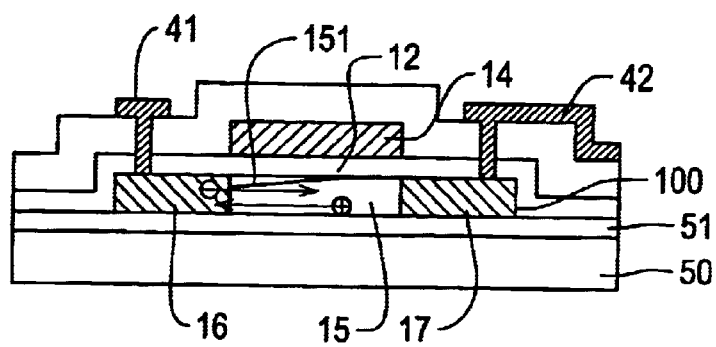
Figure 16D:
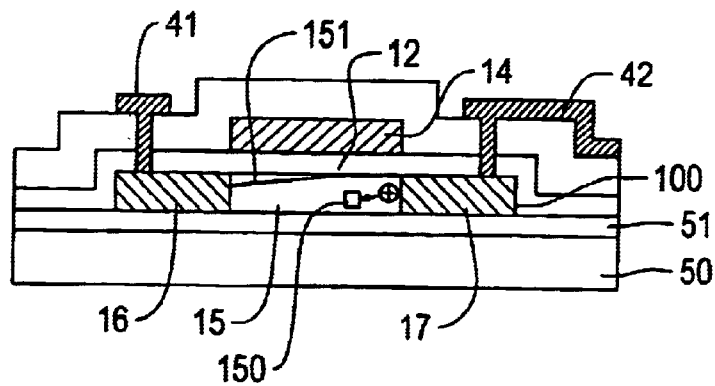

Next, as shown in FIG. 2 (D), laser beams are irradiated onto the semiconductor film 100, thus carrying out laser annealing (a crystallization process). In this crystallization process, line beams L0 are irradiated onto the semiconductor film 100 and the irradiation region L is shifted to a Y direction, as explained above with reference to FIG. 14.

Next, as shown in FIG. 2 (E), the polycrystal semiconductor film 100 is patterned in island forms by applying a photolithography technique. As shown in FIG. 3 (A), a gate insulating film 12 made of a silicone oxide film with a thickness of 600–1,500 angstroms is formed on the side of the surface by a plasma CVD method with TEOS (tetraetoxysilane) or oxygen gas as a material gas. Thereafter, as illustrated in FIG. 3 (B), a conductive film 140 containing aluminum, tantalum, molybdenum, titanium, tungsten, etc. is formed by a sputtering method. Next, as shown in FIG. 3 (C), after forming a resist mask 301 on the surface of the conductive film 140, the conductive film 140 is patterned and a gate electrode 14 is formed as shown in FIG. 3 (D).

Next, as shown in FIG. 4 (A), a resist mask 302 is formed, by a photolithography technique, that has an opening section 303 at a location near the drain region 17 on the upper layer side of the channel region 15, for example, in a region separated only by a distance equivalent to 1/3–1/10 of a channel length seen from the drain region 17.

Next, shallow etching is partially carried out onto the surface of the gate electrode 14 through the resist mask 302. As a result, as shown in FIG. 4 (B), out of the surface of the gate electrode 14, only the region that is separated just by a distance equivalent to 1/3–1/10 of a channel length seen from the drain region 17 is etched, and a thin section 141 is formed partially in the gate electrode 14.

As illustrated in FIG. 4 (C), phosphorus ions are introduced at a dosage of about $1\times10^{19}$ cm$^{-3}$ to the semiconductor film 100 with the gate electrode 14 as a mask. As a result, source region 16 and drain region 17 with a high impurity concentration of about $1\times10^{20}$ cm$^{-3}$ are formed in the semiconductor film 100 in a self-aligned condition relative to the gate electrode 14. In this case, the section of the semiconductor film 100 where no impurities are introduced becomes a channel region 15.

In addition, phosphorus ions are injected into the semiconductor film 100 (channel region 15) even from the thin section 141 of the gate electrode 14. However, the amount of impurities injected from the thin section 141 of the gate electrode 14 is small since the gate electrode 14 becomes a blocking layer. Therefore, impurities are introduced to a region equivalent to the thin section 141 of the gate electrode 14 in the semiconductor film 100 (channel region 15) in a smaller amount than that to the source region 16 and the drain region 17, and the recombination center explained with reference to FIG. 1 is then formed.

Next, as shown in FIG. 1, after an interlayer insulating film 52 is formed on the surface side of the gate electrode 14, annealing for activation is carried out under the temperature condition of 400° C., preferably lower than 300° C. Thereafter, a source 41 and a drain electrode 42 are formed after contact holes are formed in the interlayer insulating film 52. As a result, a TFT 10 is formed.

Thus, in the manufacturing method of this embodiment, the process of introducing impurities to the channel region 15 is carried out by the injection of impurities from the surface side of the channel region 15 (semiconductor film 100), so that it is suitable for concentrating the recombination center 150 on the side where the gate electrode 14 is located in the direction of thickness of the channel region 15.

Also, in this embodiment, the process of forming the recombination center 150 by introducing impurities to the semiconductor film 100 is carried out after the recrystallization process (laser annealing) on the semiconductor film 100 for forming the channel region 15, so that the semiconductor film 100 is not exposed to a high temperature atmosphere that is greater than e.g., 400° C. (preferably 300° C.). Thus, the impurities introduced to the semiconductor film 100 (channel region 15) for forming a recombination center will not be inappropriately thermally diffused, or the defects formed by the introduction of impurities (recombination center 150) will not be fixed.

Moreover, in the above-noted embodiment, the introduction of impurities to form a source and drain region was carried out at the same time with the introduction of impurities to form a recombination center; however, they may be carried out in separate processes. The procedural order of forming a thin section 141 partially in a gate electrode 14 after forming source and drain electrodes, and then forming a recombination center, for example, may be adopted.

Figure 5:
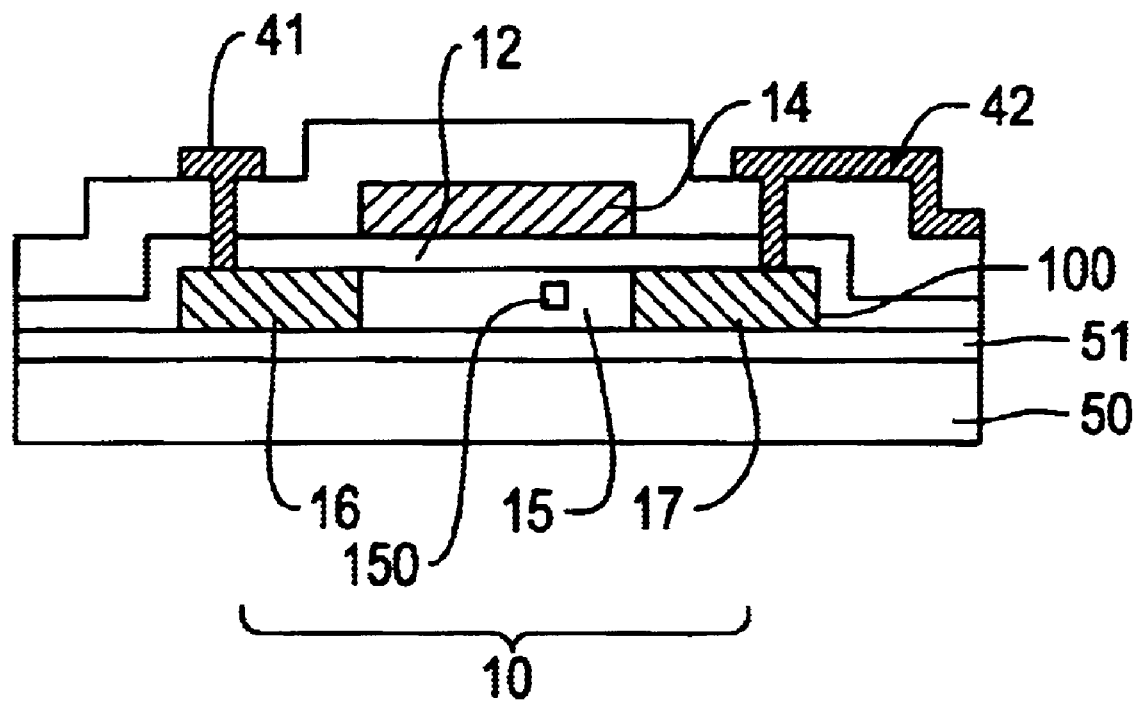
FIG. 5 is a cross-sectional view illustrating the structure of a TFT of embodiment 2 of this invention.

FIG. 5 is a cross-sectional view illustrating the structure of a TFT of embodiment 2 of the invention. As shown in FIG. 5, a bedding protective film 51 made of a silicon oxide film is also formed on the surface side of a substrate 50 in this embodiment, and a TFT 10 is formed on the surface thereof. The fundamental structure of this TFT 10 is the same as that of the TFT 10 which was explained with reference to FIG. 1, except that a gate electrode 14 has an equal film thickness. In other words, in a polycrystal semiconductor film 100 that was patterned in island forms, a channel region 15 facing a gate electrode 14 through a gate insulating film 12, a source electrode 16 connected to the channel region 15 and a drain region 17 connected to the channel region 15 on the side opposite this source region 16 are formed. Other components are the same as those in the TFT 10 of embodiment 1, so that the same reference numerals are used for the corresponding sections and the explanations are omitted.

Also in this embodiment, in the TFT 10 constructed as above, a recombination center 150 is formed in the channel region 15 by impurities such as inert-gas, metals, Group III elements, Group IV elements and Group V elements introduced to this channel region 15, or by crystal defects generated by the introduction of these impurities. The recombination center 150 concentrates on a location near the drain region 17 in the channel region 15 herein. In other words, the recombination center 150 concentrates on a region that is separated only by a distance equivalent to $\frac{1}{3}$ or $\frac{1}{10}$ of the channel length seen from the drain region 17.

Also in this embodiment, the density of the recombination center 150 is within the range from $1\times10^{13}$ cm$^{-3}$ to $1\times10^{20}$ cm$^{-3}$, and a carrier-capturing cross section at the recombination center 150 is within the range from $1\times10^{-13}$ cm$^2$ to $1\times10^{20}$ cm$^2$. Also, even in this embodiment, it may be either a structure wherein the recombination center 150 concentrates on the side where the gate electrode 14 is located in the direction of thickness of the channel region 15, or a structure wherein the recombination center 150 concentrates on the side opposite to the side where the gate electrode 14 is located in the direction of thickness of the channel region. However, the recombination center 150 is formed so as to concentrate at a suitable location in response to the correlation between the thickness of the channel region 15 and the depth of a channel formed in this channel region 15.

In the TFT 10 constructed as above, when the drain voltage rises as high as the gate voltage, hole/electron pairs are formed by hot carriers. In this embodiment, the formed holes are recombined and then captured at the recombination center 150. Thus, many of the formed holes diminish in the channel region 15, so that the channel region 15 does not reach enough potential to inject holes into the source region 16. As a result, there will be no bipolar transistor type behavior wherein electrons are injected into the channel region 15 from the source region 15 by the holes injected from the channel region 15 to the source region 16. Therefore, in case of the TFT,10 of this embodiment, as expressed with the dotted line L2 or the one-dot chain line L3 in FIG. 17, the Kink effect which sharply increases drain current at a saturation region can be restrained. As a result, by increasing the degree of crystallization of the semiconductor film 100, the TFT itself and peripheral circuits will not be damaged by excess current even if an ON-state current level or the like is raised, so that reliability can also be improved.

Figure 6A:
FIGS. 6 (A)–(C) are cross-sectional views showing the manufacturing method of the TFT shown in FIG. 5.
Figure 6B:
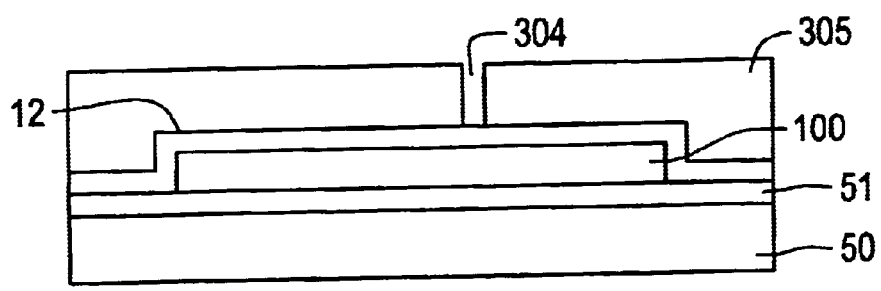
Figure 6C:
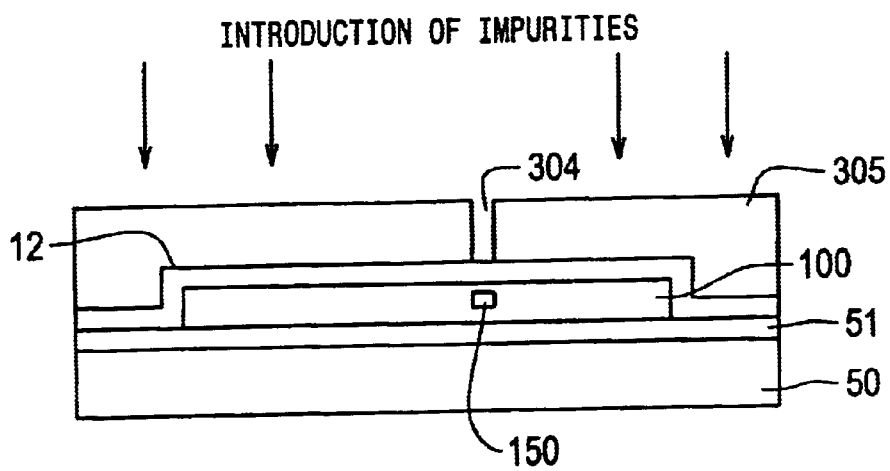
Figure 7A:
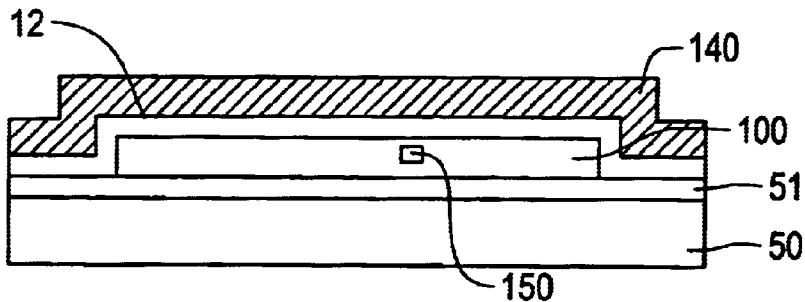
FIGS. 7 (A)–(D) are, in the manufacturing method of the TFT shown in FIG. 5, cross-sectional views showing each process that continues after the processes shown in FIGS. 6.
Figure 7B:
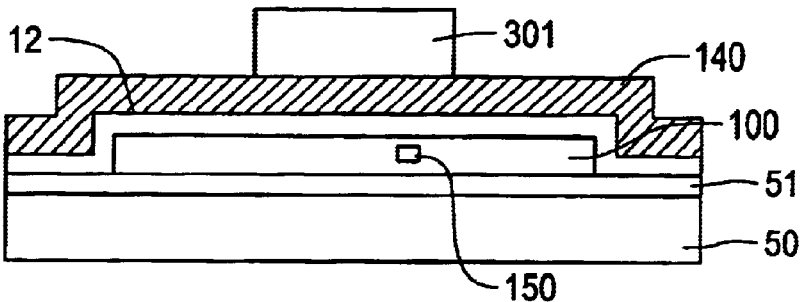
Figure 7C:
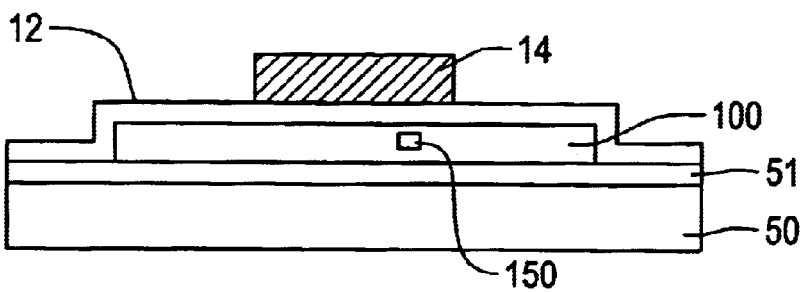
Figure 7D:
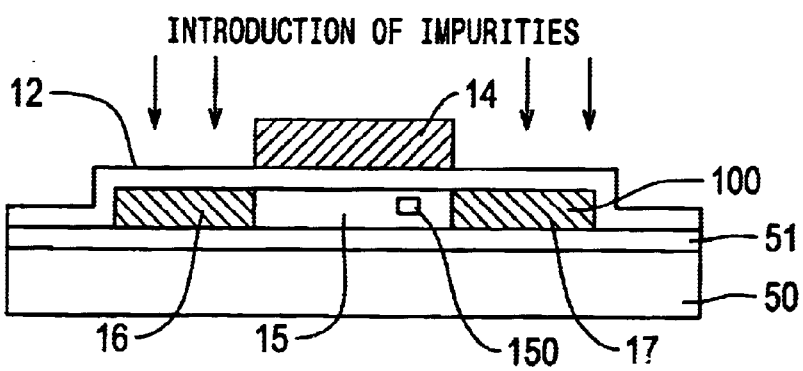

The method of manufacturing the TFT 10 having such a structure is explained with reference to FIG. 6 and FIG. 7. FIG. 6 and FIG. 7 show cross-sectional views illustrating the manufacturing method of the TFT of this embodiment. In addition, in the manufacturing method of the TFT 10 of this embodiment, the procedures up until the polycrystal semiconductor film 100 is formed are the same as the processes explained with reference to FIG. 2 (A)–FIG. 2 (E) in the TFT manufacturing method of embodiment 1. In other words, as shown in FIG. 2 (B), a bedding protective film 51 is under the condition of a substrate temperature from about 150° C. to 450° C. Then, after a semiconductor film 100 made of an amorphous silicon film is formed over the entire surface of the substrate 50 under the condition of a substrate temperature from about 150° C. to 450° C. as illustrated in FIG. 2 (C), the semiconductor film 100 is polycrystallized by laser annealing with the irradiation of laser beams to the semiconductor film 100 as shown in FIG. 2 (D), and thereafter, the polycrystal semiconductor film 100 is patterned in island forms by photolithography technique as shown in FIG. 2 (E).

Next, as shown in FIG. 6 (A), a gate insulating film 12 made of a silicon oxide film with a thickness of 600–1,500 angstroms is formed on the side of the surface by plasma CVD method with TEOS (tetraetoxysilane) or oxygen gas as a material gas. Thereafter, as illustrated in FIG. 6 (B), a resist mask 305 is formed, by a photolithography technique, that has an opening section 304 at a location near the drain region 17 at the upper layer side of the channel region 15, for example, at a location separated only by a distance equivalent to $\frac{1}{3}$–$\frac{1}{10}$ of a channel length seen from the drain region 17.

Next, as shown in FIG. 6 (C), impurities such as inert-gas, metals, Group III elements, Group IV elements and Group V elements are introduced to the semiconductor film 100 through the opening section of the resist mask. As a result, in the semiconductor film 100 (channel region 15), the impurities are introduced to the region equivalent to the opening section 304, so that a recombination center 150 is formed by the impurities or the defects formed by the introduction of the impurities.

Thereafter, as illustrated in FIG. 7 (A), a conductive film 140 containing aluminum, tantalum, molybdenum, titanium, tungsten, etc. is formed by a sputtering method. Next, as shown in FIG. 7 (B), after forming a resist mask 301 on the surface of the conductive film 140, the conductive film 140 is patterned and a gate electrode 14 is formed as shown in FIG. 7 (C). Then, as shown in FIG. 7 (D), phosphorus ions are introduced at the dosage of about $1 \times 10^{15}$ cm$^{-2}$ to the semiconductor film 100 with the gate electrode 14 as a mask. As a result, source region 16 and drain region 17 with a high impurity concentration of about $1 \times 10^{20}$ cm$^{-3}$ are formed in the semiconductor film 100 in a self-aligned condition relative to the gate electrode 14.

Next, as shown in FIG. 5, after an interlayer insulating film 52 is formed on the surface side of the gate electrode 14, annealing for activation is carried out below 400° C., preferably below 300° C. Thereafter, source 41 and drain electrodes 42 are formed after contact holes are formed in the interlayer insulating film 52. As a result, a TFT 10 is formed.

Thus, even in this embodiment, the process of introducing impurities to the channel region 15 is carried out by the injection of impurities from the surface side of the channel region 15 (semiconductor film 100), so that it is suitable for concentrating the recombination center 150 on the side where the gate electrode 14 is located in the direction of thickness of the channel region 15.

Also, in this embodiment, the process of forming the recombination center 150 by introducing impurities to the semiconductor film 100 is carried out after a recrystallization process (laser annealing) on the semiconductor film 100 for forming the channel region 15, so that the semiconductor film 100 is not exposed to a high temperature atmosphere greater than e.g., 400° C. (preferably 300° C). Thus, the impurities introduced to the semiconductor film 100 (channel region 15) for forming a recombination center will not be inappropriately thermally diffused, or the defects formed by the introduction of impurities (recombination center 150) will not be fixed.

Figure 8A:
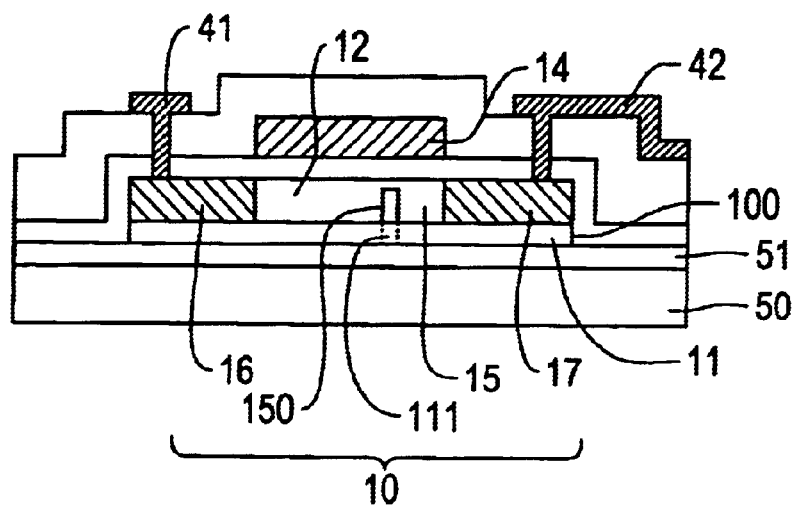
FIGS. 8 (A) and (B) are cross-sectional views illustrating the structure of a TFT of embodiment 3 of this invention and a cross-sectional view showing the modified example thereof respectively.
Figure 8B:
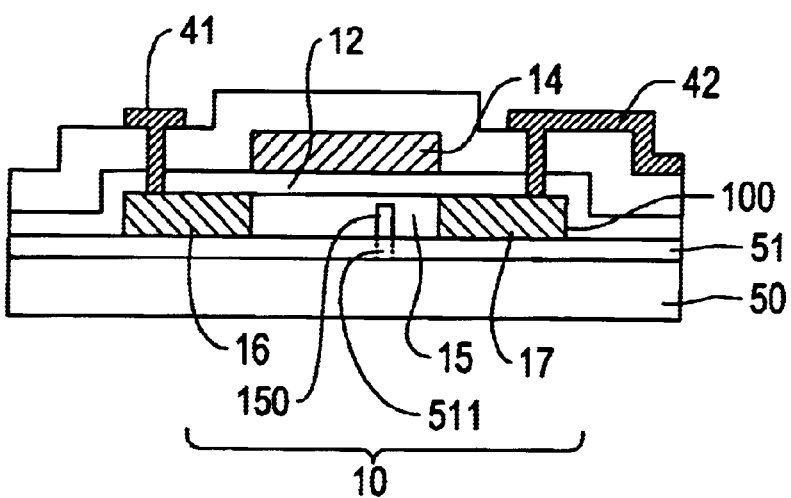
Figure 9A:
FIGS. 9 (A)–(F) are cross-sectional views showing the manufacturing method of the TFT shown in FIG. 8 (A)
Figure 9B:
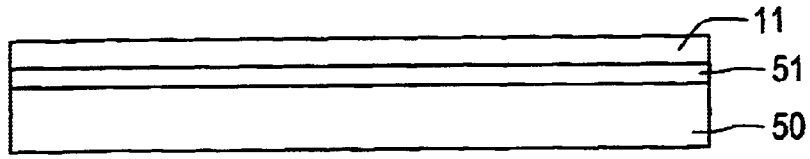
Figure 9C:
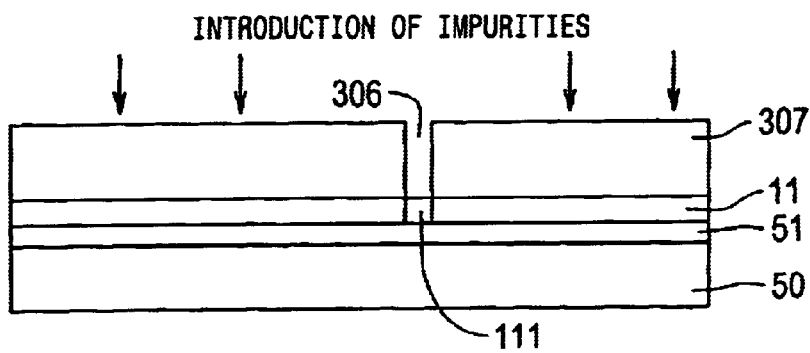
Figure 9D:
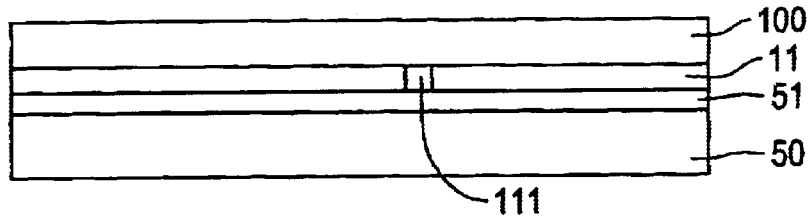
Figure 9E:
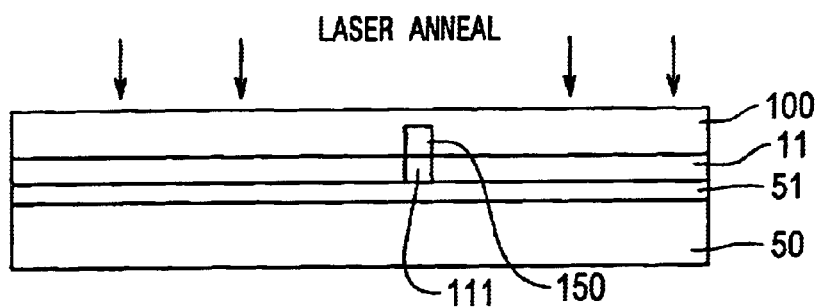
Figure 9F:
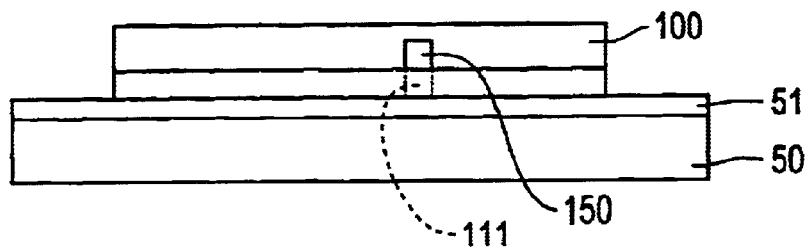
Figure 10A:
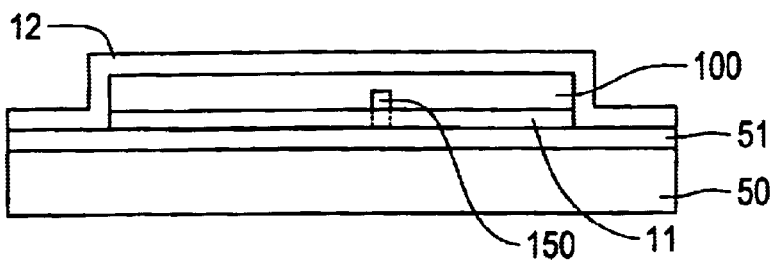
FIGS. 10 (A)–(E) are, in the manufacturing method of the TFT shown in FIG. 8 (A), cross-sectional views showing each process that continues after the processes shown in FIGS. 9.
Figure 10B:
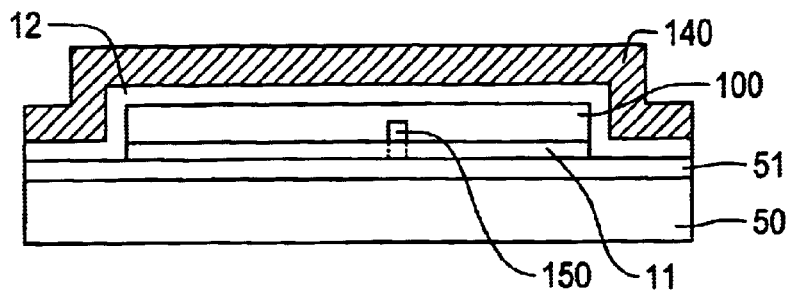
Figure 10C:
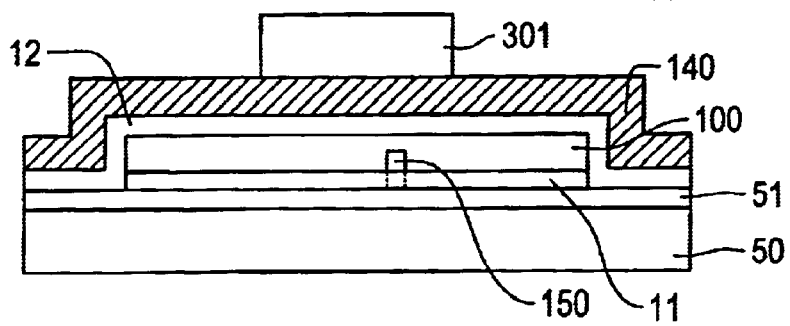
Figure 10D:
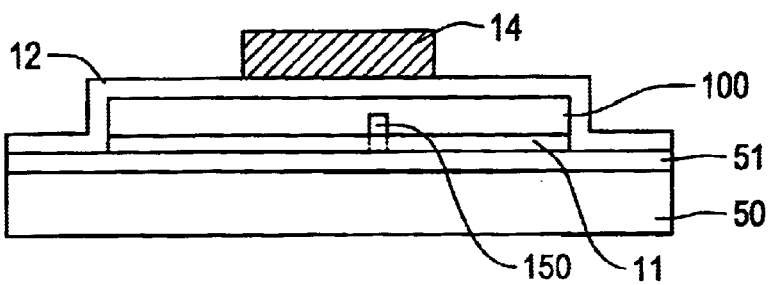
Figure 10E:
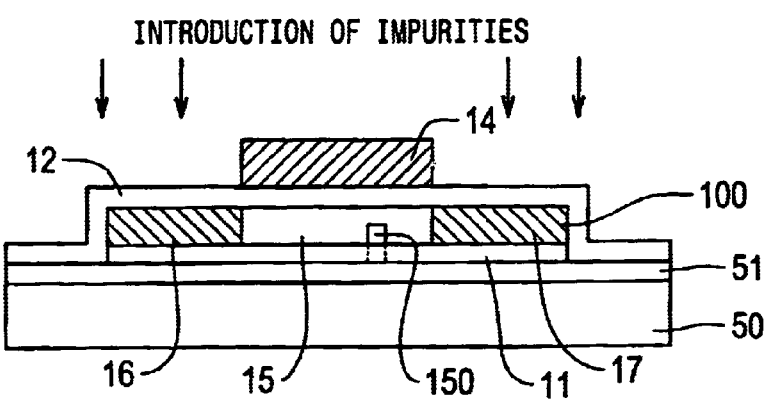

FIG. 8 (A) is a cross-sectional view illustrating the structure of a TFT of embodiment 3 of this invention. As shown in FIG. 8 (A), a bedding protective film 51 made of a silicone oxide film is also formed on the surface side of a substrate 50 in this embodiment, and a TFT 10 is formed on the surface thereof. The fundamental structure of this TFT 10 is the same as that of the TFT 10 which was explained with reference to FIG. 1, except that a semiconductor film 11 for bedding is formed at the lower layer side of the semiconductor film 100 constructing active layers. In other words, as shown in FIG. 8 (A), in a polycrystal semiconductor film 100 that was patterned in island forms, a channel region 15 facing a gate electrode 14 through a gate insulating film 12, a source electrode 16 connected to the channel region 15 and a drain region 17 connected to the channel region 15 on the side opposite this source region 16 are formed. Other components are the same as those in the TFT 10 of embodiment 1, so that the same reference numerals are used for the corresponding sections and explanations are omitted.

Also in this embodiment, in the TFT 10 constructed as above, a recombination center 150 is formed in the channel region 15 by impurities such as inert-gas, metals, Group III elements, Group IV elements and Group V elements introduced to this channel region 15, or by crystal defects generated by the introduction of these impurities. The recombination center 150 concentrates on a location near the drain region 17 in the channel region 15 herein. In other words, the recombination center 150 concentrates on a region that is separated only by a distance equivalent to $\frac{1}{3}$ or $\frac{1}{10}$ of the channel length seen from the drain region 17.

Also in this embodiment, the density of the recombination center 150 is within the range from $1 \times 10^{13}$ cm$^{-3}$ to $1 \times 10^{20}$ cm$^{-3}$, and a carrier-capturing cross section at the recombination center 150 is within the range from $1 \times 10^{-13}$ cm$^2$ to $1 \times 10^{-20}$ cm$^2$.

Also, even in this embodiment, it may be either a structure wherein the recombination center 150 concentrates on the side where the gate electrode 14 is located in the direction of thickness of the channel region 15, or a structure wherein the recombination center 150 concentrates on the side opposite the side where the gate electrode 14 is located in the direction of thickness of the channel region. However, the recombination center 150 is formed so as to concentrate at a suitable location in response to the correlation between the thickness of the channel region 15 and the depth of a channel formed in this channel region 15. The depth of the region where such a recombination center 150 concentrates can be controlled by the diffusion conditions of impurities from an impurity introducing region 111 (impurity diffusion source) of the bedding semiconductor film 11 to the semiconductor film 100 (channel region 15).

In the TFT 10 constructed as above, when the drain voltage rises as high as the gate voltage, hole/electron pairs are formed by hot carriers. In this embodiment, the formed holes are recombined and then captured at the recombination center 150. Thus, many of the formed holes diminish in the channel region 15, so that the channel region 15 does not reach enough potential to inject holes into the source region 16. As a result, there will be no bipolar transistor type behavior wherein electrons are injected into the channel region 15 from the source region 16 by the holes injected from the channel region 15 to the source region 16. Therefore, in case of the TFT 10 of this embodiment, as expressed with the dotted line L2 or the one-dot chain line L3 in FIG. 17, the Kink effect which sharply increases drain current at a saturation region can be restrained. As a result, by increasing the degree of crystallization of the semiconductor film 100, the TFT itself and peripheral circuits will not be damaged by excess current even if an ON-state current level or the like is raised, so that reliability can also be improved.

Figure 11A:
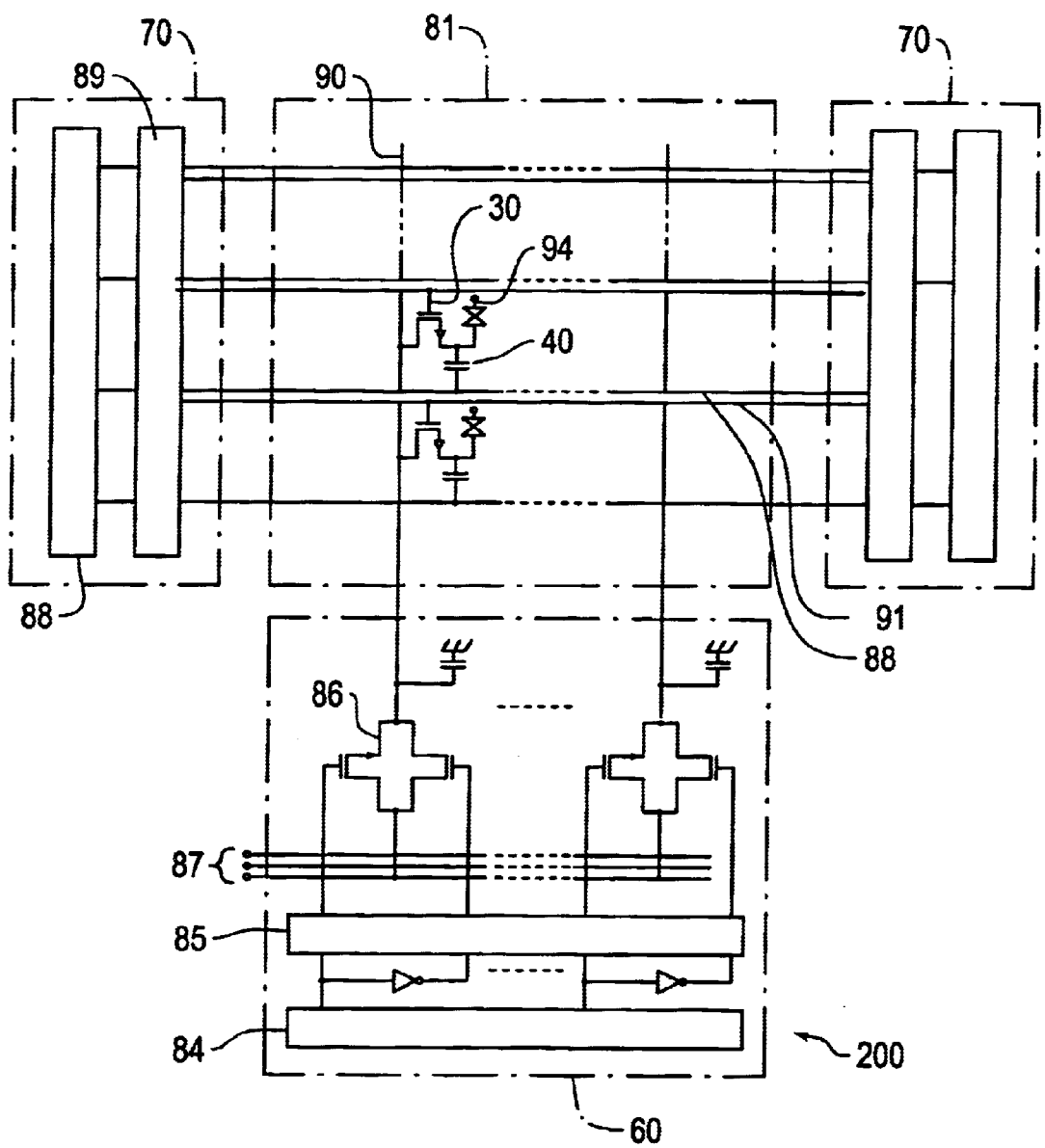
FIG. 11 (A) is a block diagram of an active matrix substrate for a liquid crystal display device, and FIG. 11 (B) is an equivalent circuit diagram of a CMOS circuit constructing the drive circuit thereof.
Figure 11B:
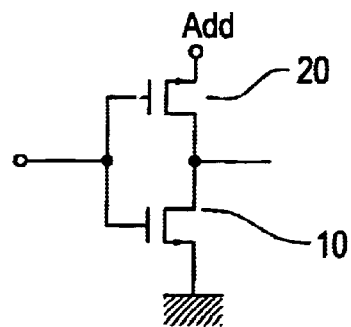
Figure 12:
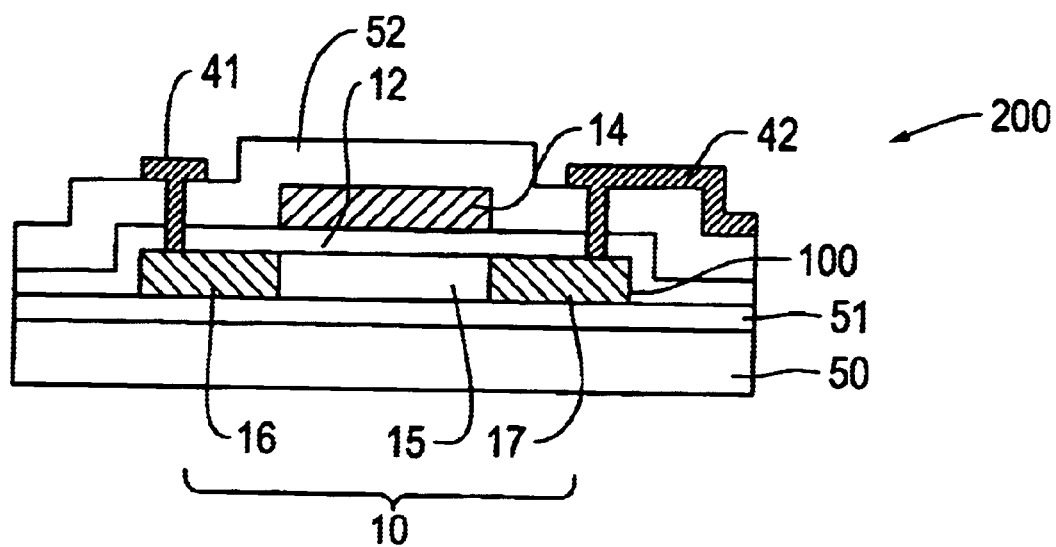
FIG. 12 is a cross-sectional view illustrating the structure of a conventional TFT.
Figure 13A:
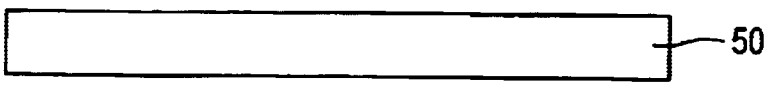
FIGS. 13 (A)–(E) are cross-sectional views showing the manufacturing method of the conventional TFT shown in FIG. 12.
Figure 13B:
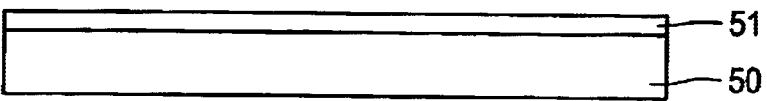
Figure 13C:
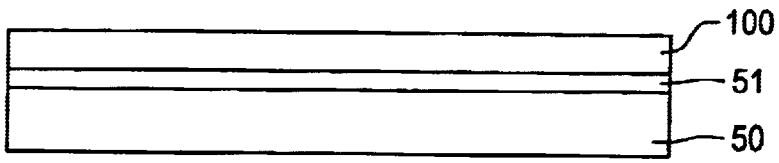
Figure 13D:
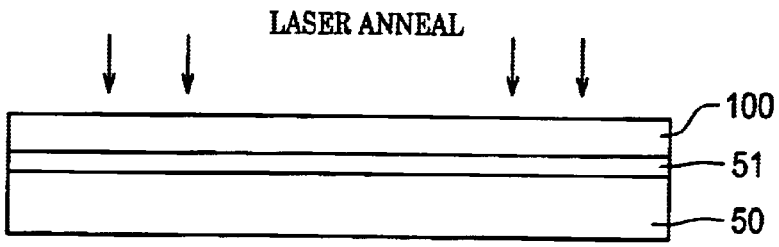
Figure 13E:
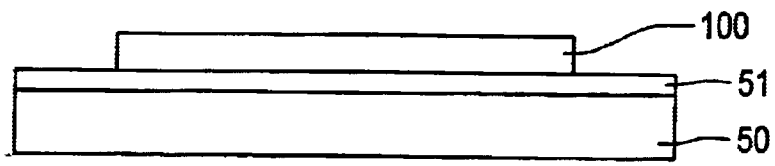

The method of manufacturing the TFT 10 having such a structure is explained with reference to FIG. 9, FIG. 10 and FIG. 11. As is apparent from the figures, FIG. 9, FIG. 10 and FIG. 11 are cross-sectional views illustrating the manufacturing method of the TFT of this embodiment.

Also, in this embodiment, a substrate 50 made of glass, etc. cleaned by ultrasonic cleaning or the like is first prepared as shown in FIG. 9 (A). Next, as shown in FIG. 9 (B), a bedding protective film made of a silicon oxide film or the like with a thickness of 2,000–5,000 angstroms is formed over the entire surface of the substrate 50 by a plasma CVD method under the condition of a substrate temperature from about 150° C. to 450° C. Additionally, a bedding semiconductor film 11 is formed on the surface of a bedding protective film 51. No crystallization is required for this bedding semiconductor film 11, so that it is formed by the low temperature process.

Next, as shown in FIG. 9 (C), a resist mask 307 is formed, by a photolithography technique, that has an opening section 306 at a location near the drain region 17 an the upper layer side of the channel region 15, for example, in a location separated only by a distance equivalent to ⅓–⅒ of a channel length seen from the drain region 17.

Next, impurities including an inert-gas, metals, Group III elements, Group IV elements or Group V elements are injected through the opening section 306 of the resist mask 307 into the bedding semiconductor film 11. As a result, in the bedding semiconductor film 11, the impurities are introduced to a region equivalent to the opening section 306, thus forming an impurity introducing region 111 (impurity diffusion source).

Next, as illustrated in FIG. 9 (D), a semiconductor film 100 made of an amorphous silicon film with a thickness of 300–700 angstroms is formed by a plasma CVD method on the surface of the bedding semiconductor film 11 formed on the substrate 50 under the condition of a substrate temperature from about 150° C. to 450° C.

Next, as shown in FIG. 9 (E), laser beams are irradiated onto the semiconductor film 100, thus carrying out laser annealing (crystallization process). In this crystallization process, line beams L0 are irradiated onto the semiconductor film 100 and the irradiation region L is shifted to the Y direction as explained above with reference to FIG. 14.

As a result, the impurities that were introduced to the impurity introducing region 111 of the bedding semiconductor film 11 thermally diffuse from the bedding semiconductor film 11 to the semiconductor film 100, and a recombination center 150 is formed.

Next, as shown in FIG. 9 (E), the polycrystal semiconductor film 100 is patterned in island forms by applying a photolithography technique. At this time, the bedding semiconductor film 11 is also patterned.

Next, as shown in FIG. 10 (A), a gate insulating film 12 made of a silicon oxide film with a thickness of 600–1,500 angstroms is formed on the surface side of the semiconductor film 100 by a plasma CVD method with TEOS (tetraetoxysilane) or oxygen gas as a material gas. As illustrated in FIG. 10 (B), a conductive film 140 containing aluminum, tantalum, molybdenum, titanium, tungsten, etc. is formed by a sputtering method.

Next, as shown in FIG. 10 (C), after forming a resist mask 301 on the surface of the conductive film 140, the conductive film 140 is patterned and a gate electrode 14 is formed as shown in FIG. 10 (D).

Next, as illustrated in FIG. 10 (E), phosphorus ions are introduced at the dosage of about $1 \times 10^{15}$ cm$^{-2}$ to the semiconductor film 100 with the gate electrode 14 as a mask. As a result, source region 16 and drain region 17 with high impurity concentrations of about $1 \times 10^{20}$ cm$^{-3}$ are formed in the semiconductor film 100 in a self-aligned condition relative to the gate electrode 14. In this case, the section where no impurities are introduced becomes a channel region 15.

Next, as shown in FIG. 8 (A), after an interlayer insulating film 52 is formed on the surface side of the gate electrode 14, annealing for activation is carried out below 400° C., preferably below 300° C. Thereafter, source 41 and a drain electrode 42 are formed after contact holes are formed in the interlayer insulating film 52. As a result, a TFT 10 is formed.

Thus, in this embodiment, the process of introducing impurities to the channel region 15 is carried out by the impurity diffusion from the impurity introducing region 111 (impurity diffusion source) of the bedding semiconductor film 11 deposited at the lower layer side of the channel region 15 (semiconductor film 100), so that it is suitable for concentrating the recombination center 150 on the side opposite (the side of the substrate 50) the side where the gate electrode 14 is located in the direction of thickness of the channel region 15.

Also, in this embodiment, the recombination center 150 is formed at the same time with the recrystallization process (laser annealing) on the semiconductor film 100 for forming the channel region 15; and after this process, it is not exposed to a high temperature atmosphere. In other words, after the recombination center 150 is formed, it is not exposed to temperature higher than 400° C. (preferably 300° C). Thus, the impurities introduced to the channel region 15 (semiconductor film 100) for forming a recombination center will not be inappropriately thermally diffused, or the defects formed by the introduction of impurities (recombination center 150) will not be fixed.

Moreover, in this embodiment, the impurity introducing region 111 formed by the injection of impurities to the bedding semiconductor film 11 is the impurity diffusion source; however, as shown in FIG. 8 (B), the section wherein impurities are locally introduced to the bedding protective film 51 may be used as the impurity diffusion source 511.

In any embodiment described above, the examples of adopting this invention to a top gate type TFT are explained, however, it is to be understood that the present invention may also be applied to a bottom gate type TFT.

As explained above, in the present invention, even if hole/electron pairs due to hot carriers are formed by an increase in drain voltage in e.g., an N type TFT, these holes/electrons are recombined and then captured at a recombination center formed in a channel region. Therefore, there is no injection of holes from the channel region to a source region, so that the injection of electrons from the source region to the channel region resulting from such an injection of holes will not occur. As a result, there are no fluctuations in saturation current caused by such bipolar transistor behavior, thus preventing drain current in a saturation region (saturation current) from increasing along with the rise of drain voltage. Thus, even if ON-state current characteristics are improved by enhancing the degree of crystallization of a semiconductor film, the TFT itself and peripheral circuits will not be damaged by excess current, etc., thus improving reliability.

What is claimed is:

1. A thin-film transistor having a channel region facing a gate electrode through a gate insulating film and a source region and a drain region connected to the channel region that are formed in a semiconductor film on a surface of an insulating substrate, the thin-film transistor further comprising a recombination center for capturing carriers that is formed in said channel region, wherein impurities are contained in said recombination center, said impurities being concentrated at a region in the channel region at a point which is separated only by a distance equivalent to $\frac{1}{3}$ to $\frac{1}{10}$ of the channel length from the drain region.

2. The thin-film transistor according to claim 1, said recombination center being formed by at least one of impurities introduced into said channel region and by crystal defects.

3. The thin-film transistor according to claim 2, wherein said impurities are selected from the group consisting of inert-gases, metals, group III elements, group IV elements and group V elements.

4. The thin-film transistor according to claim 1, said recombination center has a density within a range from $1 \times 10^{13}$ cm$^{-3}$ to $1 \times 10^{20}$ cm$^{-3}$.

5. The thin-film transistor according to claim 1, said recombination center having a carrier-capturing cross section within a range from $1 \times 10^{-13}$ cm$^2$ to $1 \times 10^{-20}$ cm$^2$.

6. The thin-film transistor according to claim 1, said recombination center being concentrated at a side where said gate electrode is located in a direction of thickness of said channel region.

7. The thin-film transistor according to claim 1, said recombination center being concentrated at a side opposite to the side where said gate electrode is located in the direction of thickness of said channel region.

8. A display device comprising a thin-film transistor having a channel region facing a gate electrode through a gate insulating film and a source region and a drain region connected to the channel region that are formed in a semiconductor film on a surface of an insulating substrate, the thin-film transistor further comprising a recombination center for capturing carriers that is formed in said channel region wherein impurities are contained in said recombination center said impurities being concentrated at a region in the channel region at a point which is separated only by a distance equivalent to $\frac{1}{3}$ to $\frac{1}{10}$ of the channel length from the drain region.

9. The thin-film transistor according to claim 6, wherein said semiconductor film has a thickness of 300 to 700 angstroms and the length in the direction of the thickness of the semiconductor film is larger than the length of said recombination center.

* * * * *